United States Patent
Stebani et al.

(10) Patent No.: US 9,939,726 B2
(45) Date of Patent: Apr. 10, 2018

(54) PHOTOPOLYMERIZABLE FLEXOGRAPHIC PRINTING ELEMENTS FOR PRINTING WITH UV INKS

(71) Applicant: Flint Group Germany GmbH, Stuttgart (DE)

(72) Inventors: Uwe Stebani, Flörsheim-Dalsheim (DE); Stefanie Döttinger, Stuttgart (DE)

(73) Assignee: Flint Group Germany GmbH, Stuttgart (DE)

( * ) Notice: Subject to any disclaimer, the term of this patent is extended or adjusted under 35 U.S.C. 154(b) by 364 days.

(21) Appl. No.: 14/145,378

(22) Filed: Dec. 31, 2013

(65) Prior Publication Data
US 2014/0113233 A1    Apr. 24, 2014

Related U.S. Application Data

(62) Division of application No. 12/993,182, filed as application No. PCT/EP2009/055775 on May 13, 2009, now Pat. No. 8,685,624.

(30) Foreign Application Priority Data

May 19, 2008  (DE) ........................ 10 2008 024 214

(51) Int. Cl.
| G03F 7/00 | (2006.01) |
| G03F 7/004 | (2006.01) |
| B41C 1/05 | (2006.01) |
| B41N 1/12 | (2006.01) |
| G03F 7/033 | (2006.01) |
| B41C 1/02 | (2006.01) |

(52) U.S. Cl.
CPC ............... *G03F 7/004* (2013.01); *B41C 1/02* (2013.01); *B41C 1/05* (2013.01); *B41N 1/12* (2013.01); *G03F 7/033* (2013.01)

(58) Field of Classification Search
CPC  B41C 1/003; B41N 1/12; G03F 7/004; G03F 7/033
USPC ............................. 430/270.1, 306; 101/368
See application file for complete search history.

(56) References Cited

U.S. PATENT DOCUMENTS

| 3,264,103 A | 8/1966 | Cohen et al. |
| 4,766,675 A | 8/1988 | Liu |
| 5,175,072 A | 12/1992 | Martens |
| 5,176,986 A | 1/1993 | Telser et al. |
| 5,948,594 A | 9/1999 | Dudek et al. |
| 5,972,565 A | 10/1999 | Dudek et al. |
| 2002/0019559 A1 | 2/2002 | Brunner et al. |
| 2003/0187114 A1 | 10/2003 | Breitscheidel et al. |
| 2004/0197711 A1* | 10/2004 | Kaczun et al. ............... 430/320 |
| 2006/0115602 A1 | 6/2006 | Beck et al. |

(Continued)

FOREIGN PATENT DOCUMENTS

| DE | 10032580 | 1/2002 |
| EP | 0 463 016 | 1/1992 |

(Continued)

*Primary Examiner* — Chanceity Robinson
(74) *Attorney, Agent, or Firm* — Drinker Biddle & Reath LLP

(57) ABSTRACT

Photopolymerizable flexographic printing elements which contain cyclohexanepolycarboxylic esters as plasticizers and also their use for producing flexographic printing forms for printing with UV inks, in particular for UV narrow web printing.

10 Claims, 1 Drawing Sheet

Schematic depiction of the measurement of the flexibility

(56) References Cited

U.S. PATENT DOCUMENTS

2006/0178446 A1* 8/2006 Bedat et al. .................. 523/160
2006/0249239 A1   11/2006 Krauss et al.
2008/0061036 A1    3/2008 Schadebrodt et al.
2008/0248428 A1* 10/2008 Teltschik et al. ............. 430/306

FOREIGN PATENT DOCUMENTS

| EP | 654150 | 5/1995 |
| EP | 833206 | 4/1998 |
| EP | 833207 | 4/1998 |
| EP | 992849 | 4/2000 |
| EP | 1069475 | 1/2001 |
| EP | 1070989 | 1/2001 |
| EP | 1072953 | 1/2001 |
| EP | 1158365 | 11/2001 |
| WO | WO-90/11344 | 10/1990 |
| WO | WO-94/03838 | 2/1994 |
| WO | WO-96/14603 | 5/1996 |
| WO | WO-99/32427 | 7/1999 |
| WO | WO-01/39897 | 6/2001 |
| WO | WO-01/88615 | 11/2001 |
| WO | WO-2004/081127 | 9/2004 |
| WO | WO-2004/092841 | 10/2004 |
| WO | WO-2005/050327 | 6/2005 |
| WO | WO 2005050327 A1 * | 6/2005 |
| WO | WO-2005/113240 | 12/2005 |

* cited by examiner

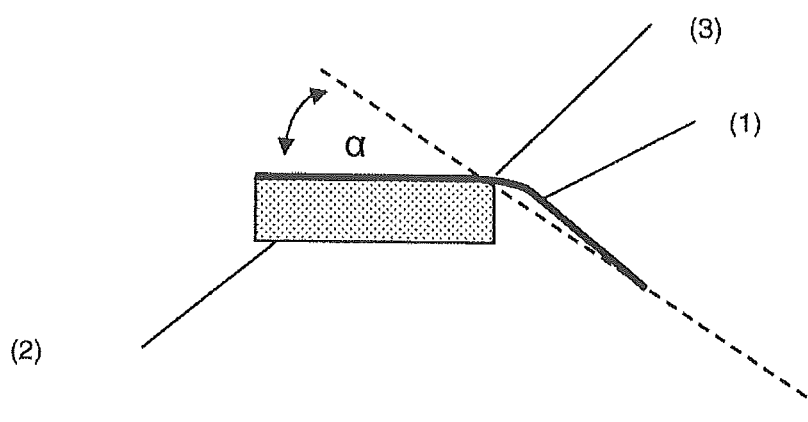
Schematic depiction of the measurement of the flexibility

PHOTOPOLYMERIZABLE FLEXOGRAPHIC PRINTING ELEMENTS FOR PRINTING WITH UV INKS

CROSS-REFERENCE TO RELATED APPLICATIONS

This application is a divisional of application Ser. No. 12/993,182, filed Jul. 1, 2011, the entire contents of which is incorporated by reference herein. application Ser. No. 12/993,182 is a national stage application (under 35 U.S.C. § 371) of PCT/EP2009/055775, filed May 13, 2009, the entire contents of which is incorporated by reference herein. PCT/EP2009/055775 claims benefit of German application DE102008024214.4, filed May 19, 2008, the entire contents of which is incorporated by reference herein.

BACKGROUND OF THE INVENTION

The present invention relates to photopolymerizable flexographic printing elements which contain cyclohexanepolycarboxylic esters as plasticizers and also their use for producing flexographic printing forms for printing with UV inks, in particular for UV narrow web printing.

Flexographic printing by means of UV inks is known in principle. The technique is used, in particular, for producing labels. In UV narrow web printing, a web, for example of paper or self-adhesive plastic films, is printed with the label pattern. The printing machines used for this purpose have printing cylinders having a relatively small diameter, for example a diameter of only from 6 to 12 cm. When mounting on the printing cylinders, the flexographic printing plates used accordingly have to be very flexible so that they can readily be bent around the small printing cylinder.

UV flexographic printing inks contain, for curing, monomers having ethylenically unsaturated groups, for example hexanediol diacrylate, dipropylene glycol diacrylate, tripropylene glycol diacrylate or else ethoxylated monomers such as ethoxylated tripropylene glycol diacrylate or ethoxylated trimethylolpropane triacrylate. Such monomers can swell flexographic printing plates over the course of time. However, swelling of the flexographic printing plate leads with increasing duration of the printing operation to undesirable changes in the printed image because fine print elements experience a volume increase due to the swelling and at the same time the hardness of the flexographic printing plate can decrease. The individual elements of the plate become broader, the shade value increase goes up and fine picture elements can run together.

The swellability of the flexographic printing plate is naturally influenced by the degree of crosslinking. The higher the degree of crosslinking, the lower the swellability of the plate. Relatively high crosslinking also increases the hardness of the flexographic printing plates under otherwise the same conditions, which can be thoroughly desirable in halftone printing. At the same time, however, the flexibility of the flexographic printing plate also decreases, i.e. it is more difficult to bend so that mounting on the printing cylinder having a small diameter becomes difficult.

It has been proposed that specific binders be used in the flexographic printing plates for printing with UV inks. EP 833 206 A and EP 833 207 A propose using specific block copolymers having styrene blocks and also isoprene or butadiene-isoprene blocks, with the peak temperature of the primary dispersion of tan δ being not more than 30° C. EP 992 849 A1 proposes using block copolymers having at least one styrene block and at least one styrene-butadiene block.

The addition of plasticizers to flexographic printing plates is known. On this subject, reference may be made by way of example to EP 992 849 A1, paragraph [0021]. White oils or oligomeric plasticizers, in particular polybutadiene oils, are particularly widespread as plasticizers in flexographic printing plates.

The flexibility of flexographic printing plates can in principle be increased by the use of plasticizers. However, relatively large amounts of plasticizers at the same time also decrease the degree of crosslinking, so that the flexographic printing plate becomes softer again and accordingly also swell to a greater degree again on contact with UV inks.

It was an object of the invention to improve the flexibility of flexographic printing plates for printing with UV inks, in particular UV narrow web printing.

BRIEF DESCRIPTION OF THE DRAWING

FIG. 1 is a schematic depiction of the measurement of the flexibility.

DETAILED DESCRIPTION OF THE INVENTION

It has surprisingly been found that this object can be achieved by the use of cyclohexanepolycarboxylic esters as plasticizers in flexographic printing plates.

We have accordingly found a photomerizable flexographic printing element for producing flexographic printing forms for printing with UV inks, which comprises at least
  a dimensionally stable support and
  a photopolymerizable, relief-forming layer comprising at least
    from 40 to 90% by weight of a thermoplastic-elastomeric block copolymer comprising at least one block which consists essentially of alkenylaromatics and at least one block which consists essentially of 1,3-dienes,
    from 1 to 20% by weight of ethylenically unsaturated monomers,
    from 0.1 to 5% by weight of photoinitiator and
    from 1 to 40% by weight of plasticizer,
  where the amounts are in each case based on the total amount of all components of the photopolymerizable layer,
  wherein at least one of the plasticizers is from 1 to 40% by weight of at least one cyclohexanepolycarboxylic ester of the general formula $R^1$—$(COOR^2)_n$, where n is 2, 3 or 4, $R^1$ is an n-valent cyclohexane radical and the radicals $R^2$ are each, independently of one another, a linear, branched or cyclic, aliphatic hydrocarbon radical having from 3 to 20 carbon atoms.

In a preferred embodiment of the invention, the thermoplastic-elastomeric block copolymer is a styrene-isoprene block copolymer.

Furthermore, we have found a process for producing flexographic printing forms using such flexographic printing elements and also the use of the flexographic printing forms obtained for flexographic printing with UV inks.

The following details regarding the invention may be provided:

in the following, the term "flexographic printing form" or "flexographic printing plate" is used for a previously crosslinked, ready-to-print printing form. The term "flexographic printing element" is used in the usual way for the photopolymerizable starting material which is used for producing flexographic printing forms or flexographic printing plates.

The photopolymerizable flexographic printing elements of the invention can be either plate-shaped flexographic printing elements or cylindrical, preferably continuous seamless flexographic printing elements.

The photopolymerizable flexographic printing elements of the invention comprise at least one dimensionally stable support and at least one photopolymerizable, relief-forming layer.

Possible dimensionally stable supports are the supports known from flexographic printing plate technology, for example films, plates or cylindrical tubes. The materials of the support can be, for example, metals such as steel or aluminum or plastics such as polyethylene terephthalate, polybutylene terephthalate, polyethylene naphthalate or polycarbonate. The supports can optionally have been treated with customary bonding layers. PET films having a thickness of from 100 to 200 μm are particularly suitable.

The photopolymerizable material present in the photopolymerizable, relief-forming layer comprises at least one thermoplastic-elastomeric block copolymer, at least one ethylenically unsaturated monomer, at least one photoinitiator, at least one plasticizer and optionally further components.

The thermoplastic-elastomeric block copolymers comprise at least one block consisting essentially of alkenylaromatics and at least one block consisting essentially of 1,3-dienes. The alkenylaromatics can be, for example, styrene, α-methylstyrene or vinyltoluene. Preference is given to styrene. The 1,3-dienes are preferably butadiene and/or isoprene. These block copolymers can be either linear, branched or radical block copolymers. In general, the block copolymers are triblock copolymers of the A-B-A type, but they can also be diblock polymers of the A-B type or copolymers having a plurality of alternating elastomeric and thermoplastic blocks, e.g. A-B-A-B-A. It is also possible to use mixtures of two or more different block copolymers. Commercial triblock copolymers frequently contain certain proportions of diblock copolymers. The diene units can be 1,2-linked or 1,4-linked. Furthermore, it is also possible to use thermoplastic-elastomeric block copolymers having end blocks of styrene and a random styrene-butadiene middle block. Of course, it is also possible to use mixtures of a plurality of thermoplastic-elastomeric binders, provided that the properties of the relief-forming layer are not adversely affected thereby.

In a preferred embodiment of the invention, the thermoplastic-elastomeric binders are at least one styrene-isoprene block copolymer, in particular a styrene-isoprene-styrene block copolymer, with the polymers also being able to contain proportions of diblock styrene-isoprene copolymer. Preferred binders of the styrene-isoprene type generally contain from 10 to 30% by weight, preferably from 12 to 28% by weight and particularly preferably from 14 to 25% by weight, of styrene. These block copolymers usually have an average molecular weight $M_w$ (weight average) of from 100 000 to 300 000 g/mol. Of course, it is also possible to use mixtures of various styrene-isoprene block copolymers. In a second embodiment of the invention, preference is given to using radial isoprene-styrene block copolymers.

The isoprene units in the polyisoprene blocks can be 1,4-linked, i.e. the remaining double bond is arranged in the chain, or 3,4-linked, i.e. the remaining double bond is arranged laterally. It is possible to use block copolymers which have essentially 1,4-linkages and binders which have certain proportions of 3,4-linkages. The lateral vinyl groups in binders having 3,4-linked isoprene units can likewise react during the course of crosslinking of the photopolymerizable layer and accordingly give a plate having high crosslinking. For example, it is possible to use styrene-isoprene block copolymers which have a vinyl group content of from 20 to 70%.

In a preferred embodiment of the invention, a radial styrene-isoprene copolymer having a vinyl group content of less than 10% can be used. In a second preferred embodiment of the invention, a mixture of two different styrene-isoprene block copolymers is used. One of these preferably has a vinyl group content of at least 20%, in particular from 20 to 70%, preferably from 25 to 45%. The other can have a lower vinyl group content, for example a vinyl group content of less than 10%. Preference is also given to using a mixture of two styrene-isoprene copolymers of which one has a high diblock content of more than 40% by weight and the second has a lower diblock content of 10-30% by weight.

Apart from the thermoplastic-elastomeric block copolymers mentioned, in particular the styrene-isoprene block copolymers, the photopolymerizable layer can also comprise further elastomeric binders different from the block copolymers. Such additional binders, also referred to as secondary binders, enable the properties of the photopolymerizable layer to be modified. An example of a secondary binder is vinyltoluene-α-methylstyrene copolymers. The amount of such secondary binders should normally not exceed 25% by weight, based on the total amount of all binders used. The amount of such secondary binders preferably does not exceed 15% by weight and particularly preferably does not exceed 10% by weight.

The total amount of binders is usually from 40 to 90% by weight based on the sum of all constituents of the relief-forming layer, preferably from 50 to 90% by weight and particularly preferably from 60 to 85% by weight.

The photopolymerizable relief-forming layer further comprises at least one ethylenically unsaturated monomer. The monomers used should be compatible with the binders and have at least one polymerizable, ethylenically unsaturated group. As monomers, it is possible to use, in particular, esters or amides of acrylic acid or methacrylic acid with monofunctional or polyfunctional alcohols, amines, amino alcohols or hydroxy ethers and esters, esters of fumaric or maleic acid and allyl compounds. Preference is given to esters of acrylic acid or methacrylic acid. 1,4-butanediol diacrylate, 1,6-hexanediol diacrylate, 1,6-hexanediol dimethacrylate, 1,9-nonanediol diacrylate or trimethylolpropane tri(meth)acrylate are preferred. It is of course possible to use mixtures of various monomers.

The relief-forming layer preferably comprises at least one ethylenically unsaturated monomer having two ethylenically unsaturated groups, in particular 1,6-hexanediol diacrylate and/or 1,6-hexanediol dimethacrylate.

The total amount of all monomers in the relief-forming layer together is from 1 to 20% by weight, preferably from 5 to 20% by weight, particularly preferably from 8 to 20% by weight, very particularly preferably from 8 to 18% by weight and for example from 12 to 18% by weight, in each case based on the sum of all constituents of the relief-forming layer. The amount of monomers having two ethylenically unsaturated groups is preferably from 5 to 20% by weight, based on the sum of all constituents of the relief-forming layer, preferably from 8 to 18% by weight.

The relief-forming, photopolymerizable layer further comprises at least one photoinitiator or a photoinitiator system. Examples of suitable initiators are benzoin or benzoin derivatives such as methylbenzoin or benzoin ethers, benzil derivatives such as benzil ketals, acylarylphosphine oxides, acylarylphosphinic esters, polycyclic quinones or benzophenones. The amount of photoinitiator in the relief-forming layer is generally from 0.1 to 5% by weight, preferably from 1 to 4% by weight and particularly preferably from 1.5 to 3% by weight, based on the amount of all constituents of the relief-forming layer.

According to the invention, the flexographic printing plate further comprises at least one cyclohexanepolycarboxylic ester of the general formula $R^1$—$(COOR^2)_n$. Here, n is 2, 3 or 4, preferably 2 or 3 and particularly preferably 2. $R^1$ is an n-linked cyclohexyl radical. The radicals $R^2$ are each, independently of one another, a linear, branched or cyclic, aliphatic hydrocarbon having from 3 to 20 carbon atoms, preferably from 4 to 18 and particularly preferably from 6 to 12 carbon atoms. Of course, it is also possible to use mixtures of various cyclohexanepolycarboxylic esters as plasticizer. Cyclohexanepolycarboxylic esters, their preparation and use as plasticizers are known in principle. Examples of such cyclohexanepolycarboxylic esters are given in WO 04/081127.

Preference is given to cyclohexanedicarboxylic esters of the formula $R^1$—$(COOR^2)_2$, where $R^1$ is in this case a divalent cyclohexane radical and $R^2$ is as defined above; these esters can be cyclohexane-1,2-dicarboxylic esters, cyclohexane-1,3-dicarboxylic esters and cyclohexane-1,4-dicarboxylic esters. Particular preference is given to cyclohexane-1,2-dicarboxylic esters.

Examples of particularly suitable cyclohexanepolycarboxylic esters include diisopropyl cyclohexane-1,2-dicarboxylate, di-n-hexyl cyclohexane-1,2-dicarboxylate, diisohexyl cyclohexane-1,2-dicarboxylate, di-n-heptyl cyclohexane-1,2-dicarboxylate, diisoheptyl cyclohexane-1,2-dicarboxylate, di-2-ethylhexyl cyclohexane-1,2-dicarboxylate, di-n-nonyl cyclohexane-1,2-dicarboxylate, diisononyl cyclohexane-1,2-dicarboxylate or di-n-dodecyl cyclohexane-1,2-dicarboxylate. Further examples are given in WO 04/081127, page 7, line 6 to page 14, line 14.

Very particular preference is given to using diisononyl cyclohexane-1,2-dicarboxylate in the flexographic printing element of the invention.

In general, the cyclohexane-1,2-dicarboxylic esters used according to the invention have alkyl radicals having from 3 to 20, preferably from 4 to 18, particularly preferably from 6 to 12, in particular 9, carbon atoms, with the alkyl radicals being able to be branched or linear. Suitable cyclohexane-1,2-dicarboxylic esters having alkyl radicals having from 3 to 20 carbon atoms are listed in US 2006/0178446, paragraphs [0032] to [0042]. The cyclohexane-1,2-dicarboxylic esters can be mixed esters, i.e. contain alkyl radicals having different chain lengths. In general, the alkyl radicals are branched, with numerous different isomeric forms of alkyl radicals of the same chain length being able to occur in the cyclohexane-1,2-dicarboxylic esters. The alkyl radicals of the cyclohexane-1,2-dicarboxylic esters used according to the invention are thus frequently isomer mixtures.

Suitable esters are, for example, the cyclohexane-1,2-dicarboxylic esters disclosed in WO 99/32427:
di(isopentyl)cyclohexane-1,2-dicarboxylate, obtainable by hydrogenation of di(isopentyl)phthalate having the Chemical Abstracts Registry Number (hereinafter: CAS No.) 84777-06-0;
d(isoheptyl)cyclohexane-1,2-dicarboxylate, obtainable by hydrogenation of di(isoheptyl)phthalate having the CAS No. 71888-89-6;
di(isononyl)cyclohexane-1,2-dicarboxylate, obtainable by hydrogenation of a di(isononyl)phthalate having the CAS No. 68515-48-0;
di(isononyl)cyclohexane-1,2-dicarboxylate, obtainable by hydrogenation of a di(isononyl)phthalate having the CAS No. 28553-12-0, based on n-butene;
di(isononyl)cyclohexane-1,2-dicarboxylate, obtainable by hydrogenation of a di(isononyl)phthalate having the CAS No. 28553-12-0 based on isobutene;
a 1,2-di-$C_9$-ester of cyclohexanedicarboxylic acid, obtainable by hydrogenation of a di(nonyl)phthalate having the CAS No. 68515-46-8;
a di(isodecyl)cyclohexane-1,2-dicarboxylate obtainable by hydrogenation of a di(isodecyl)phthalate having the CAS No. 68515-49-1;
a 1,2-di-$C_{7-11}$-ester of cyclohexanedicarboxylic acid, obtainable by hydrogenation of the corresponding phthalic ester having the CAS No. 68515-42-4;
a 1,2-di-$C_{7-11}$-ester of cyclohexanedicarboxylic acid, obtainable by hydrogenation of the di-$C_{7-11}$ phthalates having the following CAS No.: 111 381-89-6, 111 381 90-9, 111 381 91-0, 68515-44-6, 68515-45-7 and 3648-20-7;
a 1,2-di-$C_{9-11}$-ester of cyclohexanedicarboxylic acid, obtainable by hydrogenation of a di-$C_{9-11}$ phthalate having the CAS No. 98515-43-5;
a di(isodecyl) 1,2-cyclohexanedicarboxylate, obtainable by hydrogenation of a di(isodecyl)phthalate which comprises mainly di(2-propylheptyl)phthalate;
a 1,2-di-$C_{7-9}$-ester of cyclohexanedicarboxylic acid, obtainable by hydrogenation of the corresponding phthalic ester which has branched or linear $C_{7-9}$-alkyl ester groups; phthalates which can be used, for example, as starting materials have the following CAS No.:
di-$C_{7-9}$-alkyl phthalate having the CAS No. 111 381-89-6;
di-$C_7$-alkyl phthalate having the CAS No. 68515-44-6; and di-$C_9$-alkyl phthalate having the CAS No. 68515-45-7.

According to the invention, it is also possible to use hydrogenation products of mixed phthalic esters with $C_{10}$- and $C_{13}$-alcohols, as are described in DE-A 10032580.7.

Particular preference is given to the dinonyl esters of cyclohexane-1,2-dicarboxylic acid, for example the abovementioned diisononyl esters or ester mixtures, or diisononyl 1,2-cyclohexanate which is commercially available under the name Hexamoll® DINCH from BASF SE.

In addition to the cyclohexane polycarboxylic esters, the flexographic printing elements of the invention can optionally also contain further plasticizers. Examples of further plasticizers encompass paraffinic, naphthenic or aromatic mineral oils, synthetic oligomers or resins such as oligostyrene, high-boiling esters, oligomeric styrene-butadiene copolymers, oligomeric α-methylstyrene-p-methylstyrene copolymers, liquid oligobutadienes, in particular those having an average molecular weight in the range from 500 to 5000 g/mol, or liquid oligomeric acrylonitrile-butadiene copolymers or oligomeric ethylene-propylene-diene copolymers.

The amount of all plasticizers in the flexographic printing element of the invention is from 1 to 40% by weight and preferably from 1 to 20% by weight, with the proviso that the amount of all cyclohexanepolycarboxylic esters in the flexographic printing element of the invention is from 1 to 40% by weight, preferably from 1 to 20% by weight, particularly preferably from 1 to 10% by weight and for example from 2 to 8% by weight. The absolute amount of plasticizers also depends on the respective binder system. In the case of plates based on a styrene-isoprene binder system, plasticizer amounts of from 1 to 10% by weight have been found to be useful. In an advantageous embodiment of the invention, exclusively cyclohexanepolycarboxylic esters are used as plasticizers. In the case of the styrene-isoprene binder system, less plasticizer is generally required since the rubber containing generally only about 15-16% of styrene is softer than a styrene-butadiene rubber containing, for example, from 28 to 30% of styrene. In the case of plates based on a styrene-butadiene binder system, plasticizer amounts of from 20 to 40% by weight have been found to be useful. In an advantageous variant of this embodiment, the plasticizer can comprise from 1 to 10% by weight of cyclohexanepolycarboxylic esters with the balance being made up by polybutadiene oils.

The relief-forming layer can additionally contain typical additives and additional components. Examples of such additional components and additives include dyes, inhibitors for thermal polymerization, fillers or antioxidants. A person skilled in the art can make an appropriate selection depending on the desired properties of the layers. However, the amount of such additional components should generally not exceed 10% by weight, based on the amount of all components of the relief-forming layer, preferably not exceed 5% by weight.

The photopolymerizable flexographic printing element can of course also be a multilayer flexographic printing element which has two or more, generally two, photopolymerizable, relief-forming layers, with at least one of the layers comprising at least one cyclohexane polycarboxylic ester. A two-layer structure enables the bottom layer to be optimized, in particular, in respect of the elastic properties and the top layer to be optimized in respect of the printing properties, for example the ink acceptance.

The photopolymerizable flexographic printing element can optionally also have an antiadhesive layer on the relief-forming layer, as is known in principle. Such a layer is used to prevent a photographic negative laid on top during illumination from sticking fast on the photopolymerizable layer. An antiadhesive layer can, for example, comprise polyamide.

The photopolymerizable flexographic printing element can optionally also have a removable covering film, for example a PET film, on the antiadhesive layer to protect the photopolymerizable flexographic printing element from damage.

The photopolymerizable flexographic printing elements of the invention can be produced by methods known in principle to those skilled in the art, for example by melt extrusion, casting or lamination in a single-stage or multi-stage production process. They are preferably produced by means of melt extrusion, in which the constituents of the relief-forming layer are firstly mixed with one another with heating in an extruder. To produce sheet-like flexographic printing elements, the photopolymerizable composition can be discharged from the extruder through a slit die between two films and the layer composite can be calendered, with the type of films depending on the desired use. They can be films which have good adhesion to the photopolymerizable layer or can be readily removable (temporary) films. To produce sheet-like flexographic printing elements, it is usual to use a firmly adhering support film and a removable covering film. If further processing of the layer to give cylindrical flexographic printing elements by the process described in the present invention is envisaged, then two removable films are used. To produce photopolymerizable, cylindrical flexographic printing elements, a seamless layer can also be applied directly to a cylindrical support by means of ring extrusion. The thickness of the photopolymerizable layer is generally from 0.4 to 7 mm, preferably from 0.5 to 4 mm and particularly preferably from 0.7 to 2.5 mm. Photopolymerizable flexographic printing elements for UV narrow web printing generally have relatively thin photopolymerizable layers, for example layers having a thickness of from 0.7 to 2.0 mm, preferably from 1.0 to 1.8 mm.

The production of cylindrical continuous seamless flexographic printing elements and the further processing thereof to give continuous seamless printing forms can be carried out by a process based on that described in WO 2004/092841. However, it can of course also be carried out by means of other techniques.

The further processing of the photopolymerizable flexographic printing elements to produce finished flexographic printing forms can be carried out using various techniques. The flexographic printing elements can, for example, be illuminated in accordance with the image in a manner known in principle and the unilluminated regions of the relief-forming layer can subsequently be removed by means of a suitable developing process. The illumination in accordance with the image can in principle be carried out by covering the photopolymerizable flexographic printing elements with a photographic mask and illuminating the photopolymerizable flexographic printing elements through the mask. If the flexographic printing element is protected by a covering film, this is removed beforehand.

However, the generation of the image is preferably carried out by means of digital masks. Such masks are also referred to as in-situ masks. For this purpose, a layer on which an image can be generated digitally is applied to the photopolymerizable, relief-forming layer. The layer on which an image can be produced digitally is preferably an IR-ablative layer, ink-jet layer or thermographically inscribable layer.

IR-ablative layers or masks are opaque to the wavelength of actinic light and usually comprise a binder and at least one IR absorber such as carbon black. Carbon black also ensures that the layer is opaque. A mask can be inscribed into the IR-ablative layer by means of an IR laser, i.e. the layer is decomposed and removed at the places at which the laser beam strikes it. Examples for generation of images on flexographic printing elements using IR-ablative masks are disclosed, for example, in EP-A-654 150 or EP-A-1 069 475.

In the case of ink-jet layers, a layer which can be written on by means of ink-jet inks and allows transmission of actinic light, for example a gelatin layer, is applied. A mask is applied to this by means of ink-jet printers using opaque ink. Examples are disclosed in EP-A 1 072 953.

Thermographic layers are layers which contain substances which become black under the action of heat. Such layers comprise, for example, a binder and an organic silver salt and an image can be produced on them by means of a printer having a thermal head. Examples are disclosed in EP-A 1 070 989.

The layers on which images can be generated digitally can be produced by dissolving or dispersing all constituents of the respective layer in a suitable solvent and applying the solution to the photopolymerizable layer of the cylindrical flexographic printing element, followed by evaporation of the solvent. The layer on which images can be generated digitally can be applied, for example, by spraying or by means of the technique described in EP-A-1 158 365.

The layers on which images can be generated digitally can also firstly be applied in a separate coating step to a PET film which is then used in the course of the production of the flexographic printing element by means of melt extrusion to produce a sheet-like layer composite in which it is used as covering film in the calendering process.

After application of the layer on which images can be generated digitally, an image is generated on this layer by means of a suitable technique and the photopolymerizable layer is subsequently irradiated with actinic light through the mask formed in a manner known in principle. Suitable actinic, i.e. chemically "active", light is, in particular, UVA or UV/VIS radiation. Lamps for illuminating plate-like flexographic printing elements and also round lamps for the uniform illumination of cylindrical flexographic printing elements are commercially available.

The layer which has been illuminated in accordance with the image can be developed in a conventional way by means of a solvent or a solvent mixture. Here, the unilluminated regions, i.e. the regions covered by the mask, of the relief layer are removed by dissolution in the developer while the illuminated regions, i.e. crosslinked regions, are retained. The mask or the residues of the mask are likewise removed by the developer if the components are soluble therein. If the mask is not soluble in the developer, it is, if appropriate, removed by means of a second solvent before developing.

Developing can also be effected thermally. In thermal developing, no solvent is used. Instead, the relief-forming layer after illumination in accordance with the image is brought into contact with an absorbent material and heated. The absorbent material is, for example, a porous nonwoven, for example of nylon, polyester, cellulose or inorganic materials. It is heated to such a temperature that the unpolymerized components of the relief-forming layer liquefy and are soaked up by the nonwoven. The fully soaked nonwoven is subsequently removed. Details of thermal developing are disclosed, for example, by U.S. Pat. No. 3,264,103, U.S. Pat. No. 5,175,072, WO 96/14603 or WO 01/88615. The mask can, if appropriate, be removed beforehand by means of a suitable solvent or likewise thermally.

The production of flexographic printing forms from the photopolymerizable flexographic printing elements can also be carried out by means of direct laser gravure. In this process, the photopolymerizable layer is firstly crosslinked completely throughout its entire volume by means of actinic light, electron beams or γ-rays without application of a mask. A printing relief is subsequently engraved into the crosslinked layer by means of one or more lasers.

The crosslinking over the entire area can be effected using customary lamps for flexographic printing forms as described above. However, it can also be carried out particularly advantageously, especially in the case of cylindrical, continuous seamless flexographic printing forms, by a process based on that described in WO 01/39897. Here, illumination is carried out in the presence of a protective gas which is heavier than air, for example $CO_2$ or Ar. The photopolymerizable, cylindrical flexographic printing element is for this purpose lowered into a dipping tank which is filled with protective gas and whose walls are preferably lined with a reflective material, for example aluminum foil. The photopolymerizable, cylindrical flexographic printing element is subsequently illuminated with actinic light. The customary UV or UV-VIS sources of actinic light can in principle be used for this purpose. Preference is given to light sources which emit light having a wavelength of from 200 to 400 nm. For example, it is possible to use conventional UV-A tubes, UV-C tubes, UV lamps or combinations thereof.

In direct laser gravure, the relief layer absorbs laser radiation to such an extent that it is removed or at least detached in the places at which it is exposed to a laser beam of sufficient intensity. The layer is preferably vaporized or thermally or oxidatively decomposed without prior melting, so that its decomposition products are removed from the layer in the form of hot gases, vapors, smoke or small particles.

Lasers suitable for engraving the relief-forming layers used according to the invention are, in particular, lasers which have a wavelength of from 9000 nm to 12.000 nm. Particular mention may be made here of $CO_2$ lasers. The binders used in the relief-forming layer absorb the radiation of such lasers to a sufficient extent for them to be engraved.

The flexographic printing form obtained can advantageously be cleaned in a further process step after laser gravure. In some cases, this can be effected by simple blowing-off with compressed air or by brushing. However, preference is given to carrying out such cleaning using a liquid cleaner in order to be able to remove even polymer fragments completely. Suitable cleaners are, for example, aqueous cleaners which consist essentially of water and optionally small amounts of alcohols and which may contain auxiliaries such as surfactants, emulsifiers, dispersants or bases to aid the cleaning process. "Water-in-oil" emulsions as disclosed by EP-A 463 016 are also suitable. Preference is given to using cleaners which have at least one organic component which is able to detach the decomposition products deposited on the relief of the flexographic printing element during laser gravure without the relief layer being significantly swelled during the cleaning process. Such cleaners are disclosed, for example, in WO 2005/113240.

The flexographic printing forms produced by the process of the invention have very good flexibility. The effect of the cyclohexanepolycarboxylic esters used according to the invention is particularly pronounced here, especially in the case of relatively highly crosslinked, relatively hard flexographic printing forms.

The relief layer of the ready-to-print flexographic printing forms generally has a Shore A hardness in accordance with DIN 53505 of from 30 to 90 Shore A, preferably from 50 to 85 Shore A and particularly preferably from 60 to 85 Shore A and very particularly preferably from 75 to 85 Shore A, at a layer thickness of 1.14 mm. The measurements are carried out using a hardness measuring instrument, corresponding to the description of DIN 53505.

The ready-to-print flexographic printing forms can preferably be used for flexographic printing using UV inks. However, they can of course also be used for printing with other inks, e.g. conventional flexographic printing inks based on water or alcohol.

For printing using the flexographic printing forms according to the invention, in particular using the flexographic printing forms based on styrene-isoprene binders, preference is given to using printing inks having comparatively polar monomers. Suitable inks are, in particular, UV printing inks containing acrylic esters based on polyether polyols, for example ethoxylated tripropylene glycol diacrylate, ethoxylated trimethylolpropane triacrylate, dipropylene glycol diacrylate or tripropylene glycol triacrylate.

For flexographic printing with UV inks, it is possible to us conventional flexographic printing machines which are equipped for printing with UV inks. At least one flexographic printing form is mounted on a printing cylinder; for polychrome printing, three, four or even more plates are used depending on the printing technique. Afterwards, UV-curable printing ink is transferred to the flexographic printing form in a customary way by means of an inking unit, the UV-curable printing ink is transferred from the flexographic printing form to the print substrate by rotation of the printing cylinder and the UV-curable printing ink on the substrate is then cured by means of UV radiation. In the case of polychrome printing, a number of plates corresponding to the number of inking units is used.

The flexographic printing forms can preferably be used for narrow web printing. For this purpose, preference is given to using printing machines whose printing cylinder generally does not exceed a length of 60 cm and has a diameter of from 5 to 15 cm. It can, for example, have a length of from 30 to 60 cm, in particular cases even only about 10 cm. This technique enables labels, in particular self-adhesive labels such as stickers or adhesive labels made of paper and films, to be printed. Furthermore, it is possible to print, for example, wrap arounds, sleeve films, inmold labels (for example for ice cream packaging), laminates (for example for toothpaste tubes), products for special industrial applications (for example vignettes) or packaging in general made of films, paper or board.

The following examples illustrate the invention.

EXAMPLES

1. General Method for Producing the Photopolymerizable Flexographic Printing Elements:

The components for producing the photopolymerizable layer were intensively mixed with one another at a temperature of about 125° C. in a customary way in a twin-screw extruder, discharged in a customary way through a slit die and calendered between a dimensionally stable support and a covering film.

As support, a conventional PET film coated with an adhesive coating and having a thickness of 175 μm was used, and a PET film provided with a conventional antiadhesive layer and having a thickness of 125 μm was used as covering film. The composite of support layer and photopolymer, relief-forming layer had a total thickness of 1.14 mm in each case.

2. General Method for Producing the Flexographic Printing Plates

The photopolymerizable flexographic printing elements obtained as described in 1) were in each case subjected to preliminary illumination for 50 s (or 20 s) from the rear side, subsequently irradiated through an applied mask from the front with UV-A radiation under reduced pressure for 24 minutes, washed out (brush setting 0 mm) at a washout speed of 140 mm/min at 30° C. in a commercial washout solvent for flexographic printing plates (Nylosolv® A), dried at 65° C. for 2 hours and after-illuminated with UV-A radiation for 10 minutes and UV-C radiation for 20 minutes to eliminate stickiness. A commercial lamp for flexographic printing plates, viz. Nyloflex® lamp F III, was used for illumination.

To produce the long strips for flexibility measurements, illumination was carried out without application of a negative in the indicated manner to give a strip crosslinked over its entire area.

3. Determination of the Measured Values

The Shore A hardness and the flexibility were determined on each of the flexographic printing plates obtained. The measurements were carried out once after production of the flexographic printing plates and a second time after a delay time of from 9 to 13 days.

3.1 Determination of the Shore Hardness

The Shore A hardness was measured in accordance with DIN 53 505 on the 1.14 mm thick flexographic printing plates by means of a typical hardness measuring instrument by means of which the measurements were carried out in accordance with DIN 53 505.

3.2 Determination of the Flexibility

The principle of the measurement is shown schematically in FIG. 1.

To determine the flexibility, strips having a length of 30 cm and a width of 2 cm are in each case cut from full areas of the flexographic printing plate. The flexographic printing plate including support film is used for the measurement. The strips of the flexographic printing plate (1) are adhesively bonded in a length of 15 cm to a solid support (2) by means of a double-sided adhesive tape. The unsupported part of the strip of likewise 15 cm is left to hang free and bends to a greater or lesser extent under the action of gravity. The angle α between the support point of the plate (3) and the free-hanging end of the plate and the horizontal, fixed printing plate surface on the solid support is measured. For this purpose, any angle measuring device, for example that described in U.S. Pat. No. 4,766,675, can be used. The greater the angle α, the greater the flexibility of the flexographic printing plate and the more easily can it be bent around a printing cylinder.

3.3 Determination of the Swelling Data

To determine the percentage increase in weight due to swelling, a duplicate determination is carried out in each case. Here, two flexographic printing plate pieces having a size of about 1 cm×2 cm are cut, weighed and subsequently wetted completely at room temperature with the monomer or the printing ink whose swelling behavior is to be examined. Swelling is subsequently allowed to occur for 1 hour at 40° C. or 24 hours at room temperature. The specimens are subsequently cleaned of residues of adhering monomer or printing ink using a textile cloth without solvent and weighed again. The swelling as a percentage increase in mass can be calculated from the difference. Furthermore, the Shore A hardness is determined before and after swelling. The mean of two specimens is formed in each case.

Swelling experiments were carried out using hexanediol diacrylate, dipropylene glycol diacrylate and commercial UV printing inks.

4. Starting Materials Used

| | |
|---|---|
| Quintac® 3621 C | radial styrene-isoprene block copolymer, styrene content from 14 to 15% by weight, diblock content about 26%, vinyl group content from 7 to 8%. |
| Hybrar® 5125 | SIS block copolymer having a styrene content of 20% by weight, proportion of vinyl groups about 35%. |
| Kraton® D 1113 BT | SIS block copolymer having a styrene content of from 15 to 17% by weight, proportion of vinyl groups from 5 to 8%, diblock content about 55% by weight, $M_w$ about 250 000 g/mol. |
| Hexamoll® DINCH | Diisononyl cyclohexane-1,2-dicarboxylate |
| Polyöl® 130: | Polybutadiene oil having a molecular weight $M_n$ of about 3000 g/mol, a viscosity of 2700-3300 mPas at 20° C. and a proportion of 1,2-vinyl groups of about 1%. |
| Lithene® N 4 5000 | Polybutadiene oil (Synthomer) having a molecular weight $M_n$ of about 5000 g/mol, viscosity about 4000 mPas at 25° C., proportion of 1,2-vinyl groups of from about 10 to 20%. |
| Nisso® PB B-1000 | Polybutadiene oil (Nippon Soda) having a molecular weight $M_n$ of 900-1300 g/mol, a proportion of 1,2-vinyl groups of >85% and a viscosity of 5000-15 000 mPas at 45° C. |
| Winog® 70 | White oil |
| Plastomol® DNA | Diisononyl adipate |
| Monomers | 1,6-hexanediol diacrylate or 1,6-hexanediol di(meth)acrylate |
| Additives | Dyes, inhibitor for thermal polymerization |

In accordance with the general method, the photopolymerizable flexographic printing elements described below were produced and in each case processed further to give flexographic printing forms. The composition of the layer and the measured values obtained are shown in tables 1 to 4.

Trial 1 (Example 1 and Comparative Examples C1, C2 and C3)

In trial 1, a formulation having a very high degree of crosslinking was used. The formulation contains 15% by weight of monomers, a first SIS binder and 35% by weight of an SIS binder having a high proportion of vinyl groups, i.e. groups which can likewise be crosslinked. The Shore A hardness of the flexographic printing plates is from 86 to 88 in each case and thus very high. The formulations and results are shown in table 1.

In all experiments, it was observed that the flexibility after a delay in time of from 1 to 2 weeks after production of the plate continues to increase a little. The plate C1, which contains absolutely no plasticizer, has a flexibility of only 11° (after 9 days). If 7% polybutadiene oils is used as plasticizer (C2 and C3), a flexibility of from 17° to 19° is obtained, but when diisononyl cyclohexane-1,2-dicarboxylate is used according to the invention (example 1) a significantly better flexibility of 27° is obtained.

Although example 1 displays a significantly greater flexibility compared to the comparative experiments C2 and C3, the swelling values are at the same level. The swelling values in the case of the plate without plasticizer are somewhat lower. The swelling experiments also show that the more strongly polar monomer dipropylene glycol diacrylate swells the flexographic printing plates to a significantly lesser degree than the less polar monomer hexanediol diacrylate.

Trial 2 (Examples 2 and 3, Comparative Examples C3 to C6)

In trial 2, a formulation having a somewhat lower (compared to trial 1) but still high degree of crosslinking was used. The formulation contains 12.5% by weight of monomers, a first SIS binder and 36% by weight of an SIS binder having a high proportion of vinyl groups, i.e. groups which can likewise crosslink. 7.0% or 2.5% of diisononyl cyclohexane-1,2-dicarboxylate (examples 1 and 2) and in each case 7% of other plasticizers, namely 2 different polybutadiene oils, a white oil and diisononyl adipate, were used. The formulations and results are shown in table 2.

The flexibility when using 7% of diisononyl cyclohexane-1,2-dicarboxylate is 25%, and when using white oil or polybutadiene oils, values of from 19° to 21° are achieved. Although a flexibility of 33° is achieved using 7% of diisononyl adipate, the Shore A hardness is 83 and thus the lowest of all experiments.

After swelling in the acrylates HDDA, DPGDA and in UV ink, the more flexible plate as per example 2 displays no significantly higher weight increase during the course of swelling compared to C3, C4 and C5. Here too, the swelling experiments show that the relatively highly polar monomer dipropylene glycol diacrylate swells the flexographic printing plates to a significantly lesser degree than the less polar monomer hexanediol diacrylate.

Trial 3 (Example 4, Comparative Examples C7 to C9)

In trial 3, a formulation having a comparatively low degree of crosslinking was used. The amount of monomers was 12.5% by weight, but only binders low in vinyl groups were used. The initiator content was relatively low at 1.3% by weight. The Shore A hardnesses of the flexographic printing plates were accordingly only from 73 to 75. The formulations and results are shown in table 3. No large differences in the flexibility were observed.

Trial 4 (Example 5, Comparative Examples C10 and C11)

In trial 4, a formulation having a comparatively low degree of crosslinking was used. Although the amount of monomers was 18.8% by weight, only binders low in vinyl groups were used. The initiator content was relatively low at 1.5% by weight. The Shore A hardnesses of the flexographic printing plates were accordingly only from 76 to 77. The formulations and results are shown in table 4.

No large differences in the flexibility were observed. The percentage increase in weight during the course of the swelling test is generally higher than in the other trials because of the low crosslinking.

Trial 5 (Example 6, Comparative Examples C12 and C13)

In trial 5, the amount of monomers was in each case 12.5% by weight. A comparatively highly crosslinked formulation was obtained by increasing the initiator content to 2.3% by weight. In example 6, diisononyl cyclohexane-1,2-dicarboxylate was used as plasticizer, while polybutadiene oils were used in the other two experiments. The amount of plasticizer was in each case calculated approximately so that the flexographic printing plates had a comparable flexibility of in each case from 32° to 35°. The formulations and results are shown in table 5.

When using diisononyl cyclohexane-1,2-dicarboxylate, only 1.7% were necessary, while 6% of the polybutadiene oils had to be used in each case. However, this reduces the Shore A hardness significantly to 77 or 78, while the Shore A hardness was 81 when using diisononyl cyclohexane-1,2-dicarboxylate.

The examples and comparative examples show that the cyclohexanepolycarboxylic esters used according to the invention lead to flexographic printing plates having a good flexibility. This applies particularly to highly crosslinked plates having a high hardness (Shore A hardness >80) and particularly when using crosslinkable binders.

TABLE 1

| | Component | C1 | C2 | C3 | Example 1 |
|---|---|---|---|---|---|
| | Formulation for the photopolymerizable layer and results of measurement | | | | |
| Binders | SIS block copolymer (Quintac ® 3621 C) | 40.9% | 33.9% | 33.9% | 33.9% |
| | SIS block copolymer, high vinyl content (Hybrar ® 5125) | 35.0% | 35.0% | 35.0% | 35.0% |
| | Vinyltoluene - methylstyrene copolymer (Piccotex ® 100) | 5.0% | 5.0% | 5.0% | 5.0% |

TABLE 1-continued

|  | Component | C1 | C2 | C3 | Example 1 |
|---|---|---|---|---|---|
| Monomers | Hexanediol diacrylate | 11.0% | 11.0% | 11.0% | 11.0% |
|  | Hexanediol dimethacrylate | 4.0% | 4.0% | 4.0% | 4.0% |
| Initiator | Benzil dimethyl ketal | 1.8% | 1.8% | 1.8% | 1.8% |
| Plasticizers | Diisononyl cyclohexane-1,2-dicarboxylate | — | — | — | 7.0% |
|  | Polybutadiene oil (Nisso ® PB B-1000) | — | 7.0% | — | — |
|  | Polybutadiene oil (Lithene ® N 4 5000) | — | — | 7.0% | — |
| Additives | Dyes, inhibitor for thermal polymerization | 2.3% | 2.3% | 2.3% | 2.3% |
| Measured values | Flexibility, angle α [°], immediately | 7° | 9° | 10° | 12° |
|  | Flexibility, angle α [°], after 9 days | 11° | 19° | 17° | 27° |
|  | Shore A hardness after 1 day | 88 | 87 | 87 | 87 |
|  | Shore A hardness after 9 days | 88 | 87 | 87 | 86 |
| results of the swelling experiments | | | | | |
| Swelling experiments increase in mass | Swelling in hexanediol diacrylate: 1 h, 40° C. | 4.5% | 4.9% | 4.6% | 5.0% |
|  | Swelling in hexanediol diacrylate: 24 h, RT | 12.8% | 13.9% | 13.4% | 13.9% |
|  | Swelling in dipropylene glycol diacrylate: 1 h, 40° C. | 1.7% | 1.8% | 1.6% | 1.5% |
|  | Swelling in dipropylene glycol diacrylate: 24 h, RT | 3.2% | 3.6% | 3.4% | 2.9% |
|  | Commercial yellow UV printing ink: 24 h, RT | 1.6% | 2.0% | 1.9% | 1.6% |
| Swelling experiments hardness (Shore A) | Hexanediol diacrylate: before swelling | 87.5 | 87 | 86.5 | 87 |
|  | 1 h, 40° C. | 85 | 83 | 83.5 | 82.5 |
|  | 24 h, RT | 78.5 | 77.5 | 77 | 76 |
|  | Dipropylene glycol diacrylate: before swelling | 87 | 87 | 87 | 87 |
|  | 1 h, 40° C. | 85.5 | 85 | 85 | 84.5 |
|  | 24 h, RT | 84.5 | 84 | 84 | 83 |
|  | Commercial yellow UV printing ink: before swelling | 88.5 | 87 | 86.5 | 87 |
|  | 24 h, RT | 68 | 64 | 65.5 | 63 |

TABLE 2

|  | Component | Example 2 | Example 3 | C3 | C4 | C5 | C6 |
|---|---|---|---|---|---|---|---|
| Formulation of the photopolymerizable layer and results of measurements | | | | | | | |
| Binders | SIS block copolymer (Quintac ® 3621 C) | 35.4% | 37.9% | 35.4% | 35.4% | 35.4% | 35.4% |
|  | SIS block copolymer, high vinyl content (Hybrar ® 5125) | 36.0% | 38.0% | 36.0% | 36.0% | 36.0% | 36.0% |
|  | Vinyltoluene - methylstyrene copolymer (Piccotex ® 100) | 5.0% | 5.0% | 5.0% | 5.0% | 5.0% | 5.0% |
| Monomers | Hexanediol diacrylate | 9.2% | 9.2% | 9.2% | 9.2% | 9.2% | 9.2% |
|  | Hexanediol dimethacrylate | 3.3% | 3.3% | 3.3% | 3.3% | 3.3% | 3.3% |
| Initiator | Benzil dimethyl ketal | 1.8% | 1.8% | 1.8% | 1.8% | 1.8% | 1.8% |
| Plasticizers | Diisononyl cyclohexane-1,2-dicarboxylate | 7.0% | 2.5% | — | — | — | — |
|  | Polybutadiene oil (Nisso ® PB B-1000) | — | — | 7.0% | — | — | — |
|  | Polybutadiene oil (Polyöl ® 130) | — | — | — | 7.0% | — | — |
|  | White oil | — | — | — | — | 7.0% | — |
|  | Diisonoyl adipate | — | — | — | — | — | 7.0% |
| Additives | Dyes, inhibitor for thermal polymerization | 2.3% | 2.3% | 2.3% | 2.3% | 2.3% | 2.3% |
| Measured values | Flexibility, angle α [°], immediately | 13° | 8° | 10° | 11° | 10° | 20° |
|  | Flexibility, angle α [°], after 13 days | 25° | 13° | 21° | 19° | 21° | 33° |
|  | Shore A hardness after 3 days | 85 | 87 | 85 | 84 | 85 | 83 |
|  | Shore A hardness after 13 days | 85 | 88 | 86 | 85 | 85 | 83 |
| results of the swelling experiments | | | | | | | |
| Swelling experiments increase in mass | Swelling in hexanediol diacrylate: 1 h, 40° | 5.0% | 4.8% | 4.9% | 4.8% | 4.8% | 5.3% |
|  | Swelling in hexanediol diacrylate: 24 h, RT | 14.0% | 13.2% | 13.8% | 13.5% | 13.1% | 14.3% |
|  | Swelling in dipropylene glycol diacrylate: 1 h, 40° C. | 1.6% | 1.7% | 1.5% | 1.4% | 1.5% | 1.5% |
|  | Swelling in dipropylene glycol diacrylate: 24 h, RT | 2.9% | 3.0% | 3.2% | 3.2% | 3.1% | 2.3% |
|  | Commercial yellow UV printing ink: 24 h, RT | 1.6% | 1.5% | 1.9% | 1.7% | 1.9% | 1.4% |
| Swelling experiments hardness [Shore A] | Hexanediol diacrylate: before swelling | 84 | 86.5 | 83 | 84.5 | 84 | 82 |
|  | 1 h, 40° C. | 79 | 82 | 78.5 | 80 | 78.5 | 77 |
|  | 24 h, RT | 72 | 75 | 72 | 74 | 73 | 69.5 |
|  | Dipropylene glycol diacrylate: before swelling | 84.5 | 86.5 | 82.5 | 84 | 83.5 | 81.5 |
|  | 1 h, 40° C. | 83 | 85 | 81 | 83.5 | 82 | 80 |
|  | 24 h, RT | 81 | 83.5 | 79 | 82 | 80.5 | 79 |
|  | Commercial yellow UV printing ink: before swelling | 84 | 85 | 83.5 | 84.5 | 83.5 | 82 |
|  | 24 h, RT, specimen clean, 3 days storage | 83 | 84 | 82 | 84 | 82.5 | 81.5 |
|  | repeated 24 h, RT | 81 | 83 | 79 | 81.5 | 80 | 78.5 |

TABLE 3

| | Component | Example 4 | C7 | C8 | C9 |
|---|---|---|---|---|---|
| Formulation of the photopolymerizable layer and results of measurements | | | | | |
| Binders | SIS block copolymer (Quintac ® 3621 C) | 50.9% | 50.9% | 50.9% | 50.9% |
| | SIS block copolymer (Kraton ® D 1113 BT) | 20.0% | 20.0% | 20.0% | 20.0% |
| | Vinyltoluene - methylstyrene copolymer (Piccotex ® 100) | 5.0% | 5.0% | 5.0% | 5.0% |
| Monomers | Hexanediol diacrylate | 9.2% | 9.2% | 9.2% | 9.2% |
| | Hexanediol dimethacrylate | 3.3% | 3.3% | 3.3% | 3.3% |
| Initiator | Benzil dimethyl ketal | 1.3% | 1.3% | 1.3% | 1.3% |
| Plasticizers | Diisononyl cyclohexane-1,2-dicarboxylate | 8.0% | — | — | — |
| | Polybutadiene oil (Polyöl ® 130) | — | — | 8.0% | — |
| | Polybutadiene oil (Lithene ® N 4 5000) | — | 8.0% | — | — |
| | Diisononyl adipate | — | — | — | 8.0% |
| Additives | Dyes, inhibitor for thermal polymerization | 2.3% | 2.3% | 2.3% | 2.3% |
| Measured values | Flexibility, angle α [°], immediately | 43° | 45° | 43° | 41° |
| | Flexibility, angle α [°], after 1 month | 44° | 44° | 45° | 44° |
| | Shore A hardness after 1 month | 75 | 74 | 73 | 75 |
| results of the swelling experiments | | | | | |
| Swelling experiments increase in mass | Swelling in hexanediol diacrylate: 1 h, 40° C. | 9.0% | 9.5% | 9.4% | 9.1% |
| | Swelling in hexanediol diacrylate: 24 h, RT | 20.3% | 22.1% | 21.7% | 20.6% |
| | Swelling in dipropylene glycol diacrylate: 1 h, 40° C. | 2.7% | 3.4% | 3.7% | 4.8% |
| | Swelling in dipropylene glycol diacrylate: 24 h, RT | 3.2% | 3.6% | 3.4% | 2.9% |
| | Commercial yellow UV printing ink: 24 h, RT | 3.2% | 4.3% | 3.8% | 3.0% |
| Swelling experiments hardness (Shore A) | Hexanediol diacrylate: before swelling | 75 | 74 | 73 | 74.5 |
| | 1 h, 40° C. | 68 | 68 | 67 | 68 |
| | 24 h, RT | 62 | 62 | 61.5 | 62.5 |
| | Dipropylene glycol diacrylate: before swelling | 75 | 74 | 73 | 74.5 |
| | 1 h, 40° C. | 71 | 70 | 70 | 71 |
| | 24 h, RT | 69.5 | 69 | 68 | 69 |
| | Commercial yellow UV printing ink: before swelling | 74 | 71.5 | 72.5 | 74 |
| | 24 h, RT, specimen cleaned, 3 days storage | 73 | 72 | 71.5 | 73 |
| | repeated 24 h, RT | 68 | 69.5 | 68.5 | 69.5 |

TABLE 4

| | Component | Example 5 | C10 | C11 |
|---|---|---|---|---|
| Formulation of the photopolymerizable layer and results of measurements | | | | | |
| Binders | SIS block copolymer (Quintac ® 3621 C) | 68.5% | 68.5% | 68.5% |
| | Vinyltoluene - methylstyrene copolymer (Piccotex ® 100) | 5.0% | 5.0% | 5.0% |
| Monomers | Hexanediol diacrylate | 13.8% | 13.8% | 13.8% |
| | Hexanediol dimethacrylate | 5.0% | 5.0% | 5.0% |
| Initiator | Benzil dimethyl ketal | 1.5% | 1.5% | 1.5% |
| Plasticizers | Diisononyl cyclohexane-1,2-dicarboxylate | 5.0% | — | — |
| | Polybutadiene oil (Nisso ® PB B-1000) | — | 5.0% | — |
| | Polybutadiene oil (Lithene ® N 4 5000) | — | — | 5.0% |
| Additives | Dyes, inhibitor for thermal polymerization | 1.2% | 1.2% | 1.2% |
| Measured values | Flexibility, angle α [°], immediately | 41° | 39° | 41° |
| | Flexibility, angle α [°], after 12 days | 48° | 44° | 48° |
| | Shore A hardness after 12 days | 77 | 76 | 77 |
| results of the swelling experiments | | | | | |
| Swelling experiments increase in mass | Swelling in hexanediol diacrylate: 1 h, 40° C. | 5.6% | 5.7% | 6.0% |
| | Swelling in hexanediol diacrylate: 24 h, RT | 14.6% | 14.9% | 16.4% |
| | Swelling in dipropylene glycol diacrylate: 1 h, 40° C. | 1.4% | 4.6% | 2.3% |
| | Swelling in dipropylene glycol diacrylate: 24 h, RT | 2.6% | 2.9% | 4.7% |
| | Commercial yellow UV printing ink: 24 h, RT | 3.1% | 3.2% | 3.0% |
| Swelling experiments hardness (Shore A) | Hexanediol diacrylate: before swelling | 76.5 | 76.5 | 78.5 |
| | 1 h, 40° C. | 71 | 71.5 | 73.5 |
| | 24 h, RT | 66.5 | 66.5 | 67 |
| | Dipropylene glycol diacrylate: before swelling | 77 | 77 | 78.5 |
| | 1 h, 40° C. | 73.5 | 74 | 76.5 |
| | 24 h, RT | 73.5 | 74 | 75.5 |
| | Commercial yellow UV printing ink: before swelling | 76.5 | 76.5 | 78.5 |
| | 24 h, RT | 56.5 | 57.5 | 57.5 |

TABLE 5

Formulation of the photopolymerizable layer and results of measurements

|  | Component | Example 6 | C12 | C13 |
|---|---|---|---|---|
| Binders | SIS block copolymer (Quintac ® 3621 C) | 76.2% | 71.9% | 71.9% |
|  | Vinyltoluene - methylstyrene copolymer (Piccotex ® 100) | 5.0% | 5.0% | 5.0% |
| Monomers | Hexanediol diacrylate | 9.2% | 9.2% | 9.2% |
|  | Hexanediol dimethacrylate | 3.3% | 3.3% | 3.3% |
| Initiator | Benzil dimethyl ketal | 2.3% | 2.3% | 2.3% |
| Plasticizers | Diisononyl cyclohexane-1,2-dicarboxylate | 1.7% | — | — |
|  | Polybutadiene oil (Nisso ® PB B-1000) | — | 6.0% | — |
|  | Polybutadiene oil (Polyöl ® 130) | — | — | 6.0% |
| Additives | Dyes, inhibitor for thermal polymerization | 2.3% | 2.3% | 2.3% |
| Measured values | Flexibility, angle α [°], after 20 months | 32° | 35° | 32° |
|  | Shore A hardness after 20 months | 81 | 78 | 77 |

The invention claimed is:

1. A photopolymerizable flexographic printing element for producing flexographic printing forms for printing with UV inks, which comprises at least A) a dimensionally stable support and B) a photopolymerizable, relief-forming layer comprising at least 1) from 40 to 90% by weight of a thermoplastic-elastomeric block copolymer comprising at least one block which consists essentially of alkenylaromatics and at least one block which consists essentially of 1,3-dienes, 2) from 1 to 20% by weight of ethylenically unsaturated monomers, 3) from 0.1 to 5% by weight of photoinitiator and 4) from 1 to 40% by weight of at least one plasticizer, where the amounts are in each case based on the total amount of all components of the photopolymerizable layer, and wherein the at least one plasticizer comprises from 1 to 40% by weight of at least one cyclohexanepolycarboxylic ester of the general formula $R^1$—$(COOR^2)_n$ where n is 2, 3 or 4, $R^1$ represents an n-valent cyclohexane radical, and $R^2$ represents, independently of one another, a linear, branched or cyclic, aliphatic hydrocarbon radical having from 3 to 20 carbon atoms.

2. The photopolymerizable flexographic printing element as claimed in claim 1, wherein the plasticizer is a cyclohexane-1,2-dicarboxylic ester $R^1(COOR^2)_2$.

3. The photopolymerizable flexographic printing element as claimed in claim 1, wherein $R^2$ is a linear, branched or cyclic, aliphatic hydrocarbon radical having from 6 to 12 carbon atoms.

4. The photopolymerizable flexographic printing element as claimed in claim 1, wherein the plasticizer is diisononyl cyclohexane-1,2-dicarboxylate.

5. The photopolymerizable flexographic printing element as claimed in claim 1, wherein the thermoplastic-elastomeric block copolymers comprise at least one styrene-isoprene block copolymer having a styrene content of from 10 to 30% by weight.

6. The photopolymerizable flexographic printing element as claimed in claim 5, wherein the thermoplastic-elastomeric block copolymers are radial styrene-isoprene block copolymers.

7. The photopolymerizable flexographic printing element as claimed in claim 1, wherein the thermoplastic-elastomeric block copolymers are at least two different styrene-isoprene block copolymers having a styrene content of in each case from 10 to 25% by weight, with one of the two block copolymers comprising a polyisoprene block having a 1,2-vinyl group content of at least 20%.

8. The photopolymerizable flexographic printing element as claimed in claim 1, wherein the amount of ethylenically unsaturated monomers is from 5 to 20% by weight.

9. The photopolymerizable flexographic printing element as claimed in claim 1, wherein the ethylenically unsaturated monomers comprise at least one monomer having two ethylenically unsaturated groups.

10. A process for producing a flexographic printing form for printing with UV inks which comprises illuminating a photopolymerizable relief-forming layer with actinic light in accordance with an image and developing the illuminated, relief-forming layer or illuminating the entire area of the photopolymerizable, relief-forming layer and engraving a printing relief into an illuminated relief layer using a laser, wherein a photopolymerizable flexographic printing element as claimed in claim 1 is used.

* * * * *